(12) United States Patent
Lee

(10) Patent No.: US 8,742,458 B2
(45) Date of Patent: Jun. 3, 2014

(54) SEMICONDUCTOR DEVICE

(75) Inventor: Jeongsik Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/364,597

(22) Filed: Feb. 2, 2012

(65) Prior Publication Data

US 2012/0126225 A1 May 24, 2012

(30) Foreign Application Priority Data

Sep. 1, 2011 (KR) .................. 10-2011-0088647

(51) Int. Cl.
*H01L 29/06* (2006.01)
*H01L 31/00* (2006.01)
*H01L 21/02* (2006.01)

(52) U.S. Cl.
USPC ...... 257/190; 257/15; 257/194; 257/E29.246; 257/E29.252; 257/E29.253

(58) Field of Classification Search
USPC ............ 257/15, 190, 194, E29.246, E29.252, 257/E29.253
See application file for complete search history.

(56) References Cited

U.S. PATENT DOCUMENTS 7,033,912 B2 * 4/2006 Saxler ........................... 438/458
2006/0138455 A1 * 6/2006 Saxler ........................... 257/194

2010/0117118 A1 * 5/2010 Dabiran et al. ............... 257/190
2010/0126225 A1 * 5/2010 Ding et al. .................... 65/135.3
2011/0006345 A1 * 1/2011 Ota et al. ....................... 257/192
2011/0266554 A1 * 11/2011 Hikita et al. ..................... 257/76
2012/0299059 A1 * 11/2012 Takizawa et al. ............. 257/190
2013/0113018 A1 * 5/2013 Wakita et al. ................. 257/190

FOREIGN PATENT DOCUMENTS

EP 1 014 455 A1 6/2000

OTHER PUBLICATIONS

Kumakura et al.: "Minority Carrier Diffusion Lengths in MOVPE-Grown n- and p-InGaN and Performance of AlGaN/InGaN/GaN Double Heterojunction Bipolar Transistors"; Journal of Crystal Growth, vol. 298, Feb. 13, 2007; pp. 787-790; Amsterdam, Netherlands (XP005864140).
European Search Report dated Jan. 4, 2013 issued in Application No. 12 15 5007.
Schenk H, P D et al: "Growth of thick continuous GaN layers on 4-in. Si substrates by metalorganic chemical vapor deposition"; Journal of Crystal Growth; Elsevier; Amsterdam, Netherlands; vol. 314, No. 1; Jan. 1, 2011; pp. 85-91 (XP027583458).
European Search Report dated May 24, 2013 issued in Application No. 12 15 5007.

* cited by examiner

*Primary Examiner* — Victor A Mandala
(74) *Attorney, Agent, or Firm* — KED & Associates LLP

(57) ABSTRACT

A semiconductor device according to an exemplary embodiment comprises a substrate, a middle layer comprising a first semiconductor layer disposed on the substrate and comprising $Al_xGa_{1-x}N$ ($0 \leq x \leq 1$) doped with a first dopant and a second semiconductor layer disposed on the first semiconductor layer and comprising undoped gallium nitride (GaN) and a drive unit disposed on the second semiconductor layer.

13 Claims, 7 Drawing Sheets

SEMICONDUCTOR DEVICE

CROSS-REFERENCE TO RELATED APPLICATION

This application claims the priority benefit of Korean Patent Application No. 10-2011-0088647, filed on Sep. 1, 2011 in the Korean Intellectual Property Office, the disclosure of which is incorporated herein by reference.

BACKGROUND

1. Field

Embodiments relate to a semiconductor device.

2. Description of the Related Art

When growing a thin film on a primary surface of a substrate, in particular, a semiconductor substrate to form a semiconductor device, the primary surface of the semiconductor substrate is exposed to source gas for forming the thin film while the semiconductor substrate is heated. The source gas may contain, for example, an organic metal compound of a Group III nitride semiconductor as a cation or may contain a Group V element as an anion. By supplying the source gas onto the primary surface of the semiconductor substrate, the thin film is grown on the primary surface of the semiconductor substrate.

The above-mentioned method of growing the thin film is called a vapor phase growth method. Vapor phase growth method is one form epitaxial crystal growth. When growing a thin film on a substrate using the vapor phase growth method, for example, a material of the thin film may be different from that of the substrate. The method of growing the thin film made of a material different from that of the substrate on the substrate is called a hetero epitaxial growth method. Moreover, the thin film formed using the hetero epitaxial growth method is called a hetero epitaxial film, and an interface between the hetero epitaxial film and the substrate is called a hetero interface. As will be described later, the substrate refers to a member on which a target thin film is formed, and the substrate may comprise a single-layered substrate on a primary surface of which the target thin film is formed, and a substrate comprising one or more thin films previously formed thereon (a substrate on which an epitaxial film is previously formed and is defined as an epi-wafer). In the latter case, the target thin film is formed on the previously-formed thin film on the substrate.

When forming the above mentioned hetero epitaxial film, for example, an InGaN thin film grown on a group III nitride semiconductor film such as a GaN crystal film may be problematic in that it is difficult to achieve a sharp gradient of an indium (In) concentration change near an interface between the InGaN film and the GaN film.

To be specific, the InGaN thin film having a desired indium concentration may not be formed on the GaN film. For example, when forming the InGaN thin film having a thickness of approximately 5 nm, a transition layer having a lower indium (In) concentration may be formed up to approximately 1 to 2 nm in a direction of the thickness of the InGaN film from the interface between the InGaN and GaN films. Such a transition layer may prevent the indium concentration change nearby the interface between the InGaN film and GaN film from having a sharp gradient. This phenomenon may also occur when growing an AlGaN thin film on the GaN crystal film in the hetero epitaxial growth manner.

The transition layer having such a lower or non-uniform indium concentration, formed near the interface using the hetero epitaxial growth method, may deteriorate characteristics of the semiconductor device employing the hetero epitaxial film. Therefore, in order to improve the characteristics of the semiconductor device employing the hetero epitaxial film, it is necessary to suppress the transition layer so that the sharp gradient of the concentration of the thin film near the hetero interface is achieved when using the hetero epitaxial growth method.

SUMMARY

One exemplary embodiment provides a semiconductor device comprising a substrate, middle layers comprising a first semiconductor layer disposed on the substrate and comprising $Al_xGa_{1-x}N$ ($0 \leq x \leq 1$) doped with a first conduction type dopant and a second semiconductor layer disposed on the first semiconductor layer and comprising undoped gallium nitride (GaN), and a drive unit disposed on the second semiconductor layer.

BRIEF DESCRIPTION OF THE DRAWINGS

Details of the embodiments will be more clearly understood from the following detailed description taken in conjunction with the accompanying drawings, in which.

DETAILED DESCRIPTION OF EMBODIMENTS

Figure 1:
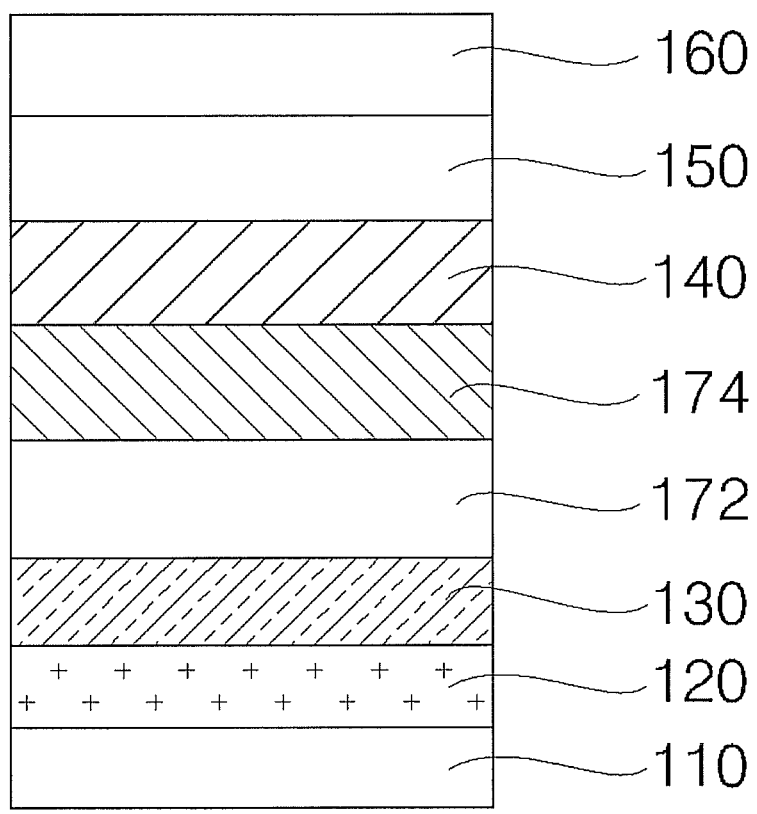
FIG. 1 is a cross-sectional view of a structure of a semiconductor device according to one exemplary embodiment.

Reference will now be made in detail to embodiments, examples of which are illustrated in the accompanying drawings. However, the present disclosure may be embodied in many different forms and should not be construed as limited to the embodiments set forth herein. Rather, these embodiments are provided so that this disclosure will be thorough and complete, and will fully convey the scope of the disclosure to those skilled in the art. The present disclosure is defined only by the categories of the claims. In certain embodiments, detailed descriptions of device constructions or processes well known in the art may be omitted to avoid obscuring the disclosure by a person of ordinary skill in the art. Wherever possible, the same reference numbers will be used throughout the drawings to refer to the same or like parts.

Spatially-relative terms such as "below", "beneath", "lower", "above", or "upper" may be used herein to describe one element's relationship to another element as illustrated in the figures. It will be understood that spatially-relative terms are intended to encompass different orientations of the device in addition to the orientations depicted in the figures. For example, if the device in one of the figures is turned over, elements described as "below" or "beneath" other elements would then be oriented "above" the other elements. The exemplary terms "below" or "beneath" can, therefore, encompass both an orientation of above and below. Since the device may be oriented in another direction, the spatially-relative terms may be interpreted in accordance with the orientation of the device.

The terminology used in the present disclosure is for the purpose of describing particular embodiments only and is not intended to limit the disclosure. As used in the disclosure and the appended claims, the singular forms "a", "an" and "the" are intended to comprise the plural forms as well, unless context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (comprising technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, the thickness or size of each layer is exaggerated, omitted, or schematically illustrated for convenience of description and clarity. Also, the size or area of each constituent element does not entirely reflect the actual size thereof.

Hereinafter, embodiments will be described in detail with reference to the drawings.

FIG. 1 to FIG. 4 are cross-sectional views of structures of semiconductor devices 100 and 200 according to various exemplary embodiments.

Referring to FIG. 1, there is illustrated a semiconductor device 100 according to one exemplary embodiment. The semiconductor device 100 comprises a substrate 110, middle layers 140 and 150 comprising a first semiconductor layer 140 disposed on the substrate 110 and comprising $Al_xGa_{1-x}N$ ($0 \le x \le 1$) doped with a first conduction type dopant and a second semiconductor layer 150 disposed on the first semiconductor layer 140 and comprising undoped gallium nitride (GaN), and a drive unit 160 disposed on the second semiconductor layer 150.

The substrate 110 may be disposed under the first semiconductor layer 140. The substrate 110 may support the first semiconductor layer 140. The substrate 110 may receive heat from the first semiconductor layer 140.

The material of the substrate 110 may be a semiconductor material, a metal material, a composite material or a combination thereof. The substrate 110 may be comprised the semiconductor material depending on implementation. For example, the substrate 110 may be comprised a carrier wafer such as a silicon (Si), germanium (Ge), gallium arsenide (GaAs), zinc oxide (ZnO), silicon carbide (SiC), silicon germanium (SiGe), gallium nitride (GaN) or gallium (III) oxide ($Ga_2O_3$) carrier wafer.

The substrate 110 may be comprised an electrically conductive material. The substrate 110 may be comprised a metal material according to implementation. For example, the substrate 110 may be comprised any one selected from a group consisting of gold (Au), nickel (Ni), tungsten (W), molybdenum (Mo), copper (Cu), aluminum (Al), tantalum (Ta), silver (Ag), platinum (Pt), chromium (Cr) and an alloy thereof. The substrate 110 may be formed in a stack of two or more layers made of the above-described metal elements respectively.

A first buffer layer 120 is disposed on the substrate 110 and a second buffer layer 130 is disposed on the first buffer layer 120. The first and/or second buffer layers 120 and/or 130 may be comprised a material having a different lattice constant from that of the material of the substrate 110. The first and/or second buffer layers 120 and/or 130 may be comprised a material having a lattice constant characteristic similar to that of the material of the first and/or second semiconductor layers 140 and/or 150. For example, when the lattice constant of the material of the first and/or second semiconductor layers 140 and/or 150 is smaller than that of the material of the substrate 110, the lattice constant of the material of the first and/or second buffer layers 120 and/or 130 is smaller than that of the material of the substrate 110. When the lattice constant of the material of the first and/or second semiconductor layers 140 and/or 150 is larger than that of the material of the substrate 110, the lattice constant of the material of the first and/or second buffer layers 120 and/or 130 is larger than that of the material of the substrate 110. The first and/or second buffer layers 120 and/or 130 may have stress.

The first buffer layer 120 may be of aluminum nitride (AlN). Source gas for forming the first buffer layer 120 may contain aluminum (Al), trimethyl aluminum (TMA), triethyl aluminum (TEA), trimethylamine aluminum (TMMA), dimethylethylamine aluminum (DMEAA), triisobutyl aluminum (TIBA), etc., and reaction gas may contain ammonia ($NH_3$). The source and reaction gases are introduced to a reaction chamber and react with each other at 500 to 600° C. to form the first buffer layer 120. The present disclosure is not limited thereto.

The second buffer layer 130 may be comprised aluminum gallium nitride (AlGaN). The first and/or second buffer layers 120 and/or 130 may be grown in a single-crystal form on the substrate 110. The present disclosure is not limited thereto.

The first and/or second buffer layers 120 and/or 130 may reduce lattice mismatching between the substrate 110 and the first semiconductor layer 140. The first and/or second buffer layers 120 and/or 130 may enable the first semiconductor layer 140 to be easily grown thereon. The first and/or second buffer layers 120 and/or 130 may improve crystal characteristics of the first semiconductor layer 140. The first and/or second buffer layers 120 and/or 130 may be comprised a material to reduce a difference in lattice constant between the substrate 110 and the first semiconductor layer 140.

In the semiconductor device 100 according to one exemplary embodiment, the material of the first and/or second buffer layers 120 and/or 130 may have a smaller lattice constant than that of the material of the substrate 110. When the first and/or second buffer layers 120 and/or 130 having a smaller lattice constant than that of the substrate 110 is disposed on the substrate 110, stress may occur at the first and/or second buffer layers 120 and/or 130, so that the first and/or second buffer layers 120 and/or 130 may be bent in a concave shape.

Although the first and/or second buffer layers 120 and/or 130 may be comprised the nitride material, the first and/or second buffer layers 120 and/or 130 may be formed using a different method than that used in forming the first and/or second semiconductor layers 140 and/or 150. The present disclosure is not limited thereto. In some cases, the first and/or second buffer layers 120 and/or 130 may be formed using MOCVD. Alternatively, the first and/or second buffer layers 120 and/or 130 may be rapidly disposed on the substrate 110 using sputtering or HVPE.

The semiconductor device 100 may further comprise third and/or fourth buffer layers 172 and/or 174 interposed between the substrate 110 and the buffer layers 140 and 150. The fourth buffer 174 may be disposed on the third buffer layer 172.

The third buffer layer 172 may comprise undoped $Al_xGa_{1-x}N$ (0≤x≤1). The fourth buffer layer 174 may comprise undoped gallium nitride (GaN).

The third and/or fourth buffer layers 172 and/or 174 need not be doped with a P type dopant and hence have an improved crystal characteristic. Thus, the third and/or fourth buffer layers 172 and/or 174 may improve crystal characteristics of the first and second semiconductor layers 140 and 150.

The middle layers 140 and 150 may be disposed on the substrate 110. In another exemplary embodiment, the middle layers 140 and 150 may be disposed on the second buffer layer 130 or fourth buffer layer 174.

The middle layers 140 and 150 may comprise the first semiconductor layer 140 and the second semiconductor layer 150 disposed on the first semiconductor layer 140. The first semiconductor layer 140 may be grown on the second buffer layer 130. The present disclosure is not limited thereto.

The first semiconductor layer 140 may be comprised $Al_xGa_{1-x}N$ (0≤x≤1). The first semiconductor layer 140 may be doped with a first dopant which may be a P type dopant. The first dopant may be magnesium (Mg), zinc (Zn), calcium (Ca), strontium (Sr), carbon (C), barium (Ba) or the like.

The first semiconductor layer 140 may be doped with a P type dopant to contain holes therein. The first semiconductor layer 140 may be comprised gallium nitride (GaN) when x (a concentration of aluminum) is zero. When the first semiconductor layer 140 contains the holes, it may be possible to suppress current leakage resulting from a piezoelectric field effect occurring between the layers by the pressure generated due to differences in lattice constant between the substrate 110, the first buffer layer 120, the second buffer layer 130, the first semiconductor layer 140 and second semiconductor layer 150. When the first semiconductor layer 140 contains the holes, it may be possible to prevent electrons from staying between the second buffer layer 130 and the second semiconductor layer 150. Accordingly, bending of an energy band between the first semiconductor layer 140 and second semiconductor layer 150 may be minimized and hence a piezoelectric field effect may be reduced. Thus, current leakage due to 2DEG (2 Dimensional electron gas) may be suppressed.

The second semiconductor layer 150 may be disposed on the first semiconductor layer 140. The second semiconductor layer 150 may comprise undoped gallium nitride (GaN). For example, the second semiconductor layer 150 may be formed by supplying $NH_3$ and trimethyl gallium (TMG) onto the second buffer layer 130 at 700° C. The present disclosure is not limited thereto. The second semiconductor layer 150 may be formed as an undoped layer having a predetermined thickness.

Since the first and second semiconductor layers 140 and 150 have a smaller lattice constant than that of the substrate 110, the first and second semiconductor layers 140 and 150 have a stress like the first and/or second buffer layers 120 and/or 130. The first and second semiconductor layers 140 and 150 may exert the stress and hence may be bent in a convex shape. This stress may counteract the stress of the substrate 110, the first buffer layer 120 or the second buffer layer 130.

Since bending of the first and second semiconductor layers 140 and 150 is minimized, the semiconductor device 100 has a uniform concentration of aluminum.

Referring to FIG. 1, the semiconductor device 100 may further comprise a third buffer layer 172 disposed between the substrate 110 and the middle layers 140 and 150 and comprising undoped $Al_xGa_{1-x}N$ (0≤x≤1) and a fourth buffer layer 174 disposed between the third buffer layer 130 and the middle layers 140 and 150, and comprising undoped gallium nitride (GaN).

The third buffer layer 172 comprises undoped $Al_xGa_{1-x}N$ (0≤x≤1) to have an improved crystal characteristic. The third buffer layer 172 may be comprised gallium nitride (GaN) when x (a concentration of aluminum) is zero. The third and fourth buffer layers 172 and 174 are stacked on top of each other to minimize bending of the semiconductor layers. Thus, current leakage due to the 2DEG (2 Dimensional electron gas) may be suppressed.

Figure 2:
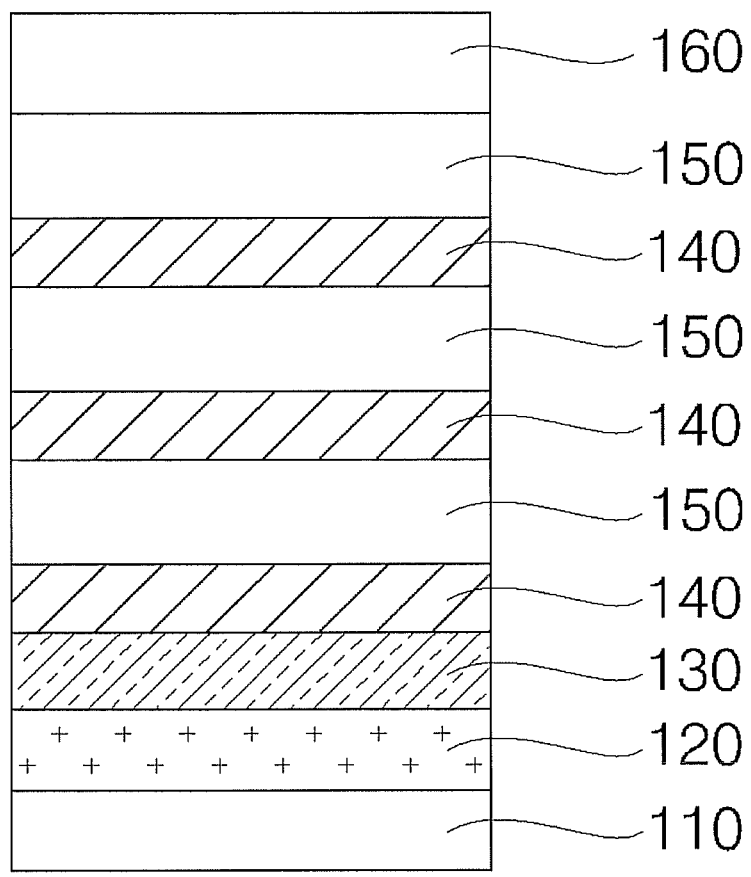
FIG. 2 is a cross-sectional view of a structure of a semiconductor device according to one exemplary embodiment.

Referring to FIG. 2, the first semiconductor layer 140 comprises a plurality of first semiconductor layers 140 and the second semiconductor layer 150 comprises a plurality of second semiconductor layers 150. The first and second semiconductor layers 140 and 150 are disposed to alternate with each other. As the alternating number of the first and second semiconductor layers 140 and 150 increases, the stress of the first and second semiconductor layers 140 and 150 increasingly counteracts the stress of the substrate 110, the first buffer layer 120 or the second buffer layer 130.

Although the first and/or second semiconductor layers 140 and/or 150 are grown at a slow growth rate, the first and/or second semiconductor layers 140 and/or 150 have an excellent crystal characteristic. On the other hand, when the first and/or second buffer layers 120 and/or 130 are grown at a slow growth rate, the first and/or second buffer layers 120 and/or 130 do not have an excellent crystal characteristic. The first and/or second semiconductor layers 140 and/or 150 may be formed using a different method than that used in forming the first and/or second buffer layers 120 and/or 130. The present disclosure is not limited thereto.

For example, the first and/or second semiconductor layers 140 and/or 150 may be formed using MOCVD (metal organic chemical vapor deposition), CVD (chemical vapor deposition), PECVD (plasma enhanced CVD), MBE (molecular beam epitaxy) or HVPE (hydride vapor phase epitaxy), etc. The present disclosure is not limited thereto.

Figure 3A:
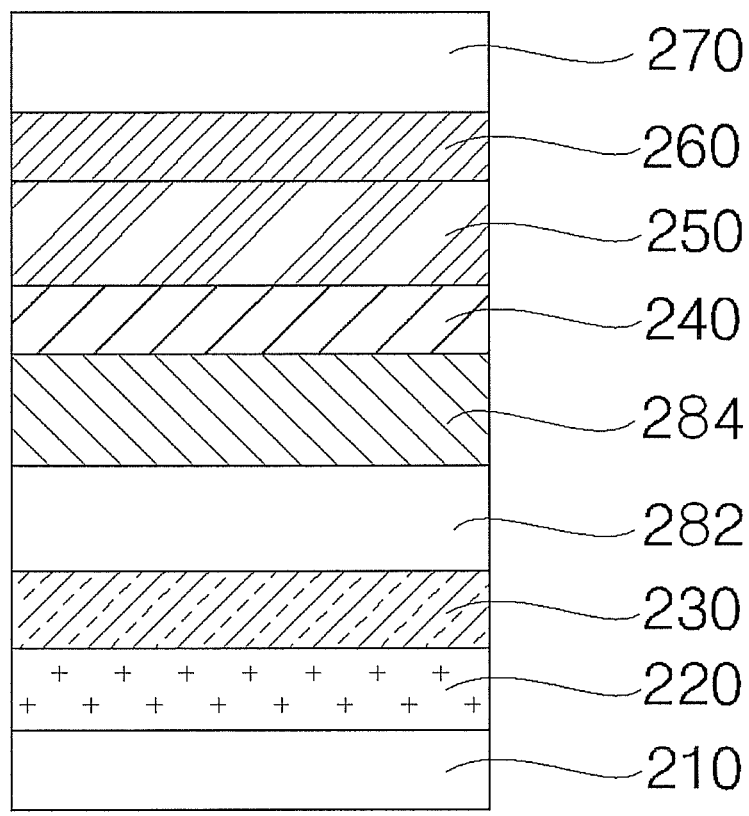
FIG. 3A is a cross-sectional view of a structure of a semiconductor device according to one exemplary embodiment.

Referring to FIG. 3A, there is illustrated a semiconductor device 200 according to one exemplary embodiment. The semiconductor device 200 comprises a substrate 210, middle layers 240, 250 and 260 comprising a first semiconductor layer 240 disposed on the substrate 210 and comprising $Al_xGa_{1-x}N$ (0≤x≤1), a second semiconductor layer 250 disposed on the first semiconductor layer 240 and comprising undoped gallium nitride (GaN) and a third semiconductor layer 260 disposed on the second semiconductor layer 250 and doped with a first dopant, and a drive unit 270 disposed on the middle layers 240, 250 and 260.

The same descriptions as in FIG. 1 and FIG. 2 may be omitted hereinafter.

The substrate 210 may be disposed under the first, second and third semiconductor layers 240, 250 and 260 and may support the same.

On the substrate 210, a first buffer layer 220 may be disposed. On the first buffer layer 220, a second buffer layer 230 may be disposed. The material or deposition method for forming the first and/or second buffer layers 220 and/or 230 may be the same as described above.

The semiconductor device 200 may further comprise third and/or fourth buffer layers 282 and/or 284 interposed between the substrate 210 and the middle layers 240, 250 and 260. The fourth buffer layer 284 may be formed on the third buffer layer 282.

The third buffer layer 282 may comprised undoped $Al_xGa_{1-x}N$ (0≤x≤1). The fourth buffer layer 284 may comprise undoped gallium nitride (GaN).

The third and/or fourth buffer layers 282 and/or 284 may not be doped with a P type dopant to have excellent crystal characteristic. Thus, the third and/or fourth buffer layers 282 and/or 284 may improve crystal characteristics of the first, second and third semiconductor layers 240, 250 and 260 thereon.

The first semiconductor layer 240 may be comprised $Al_xGa_{1-x}N$ (0≤x≤1). The first semiconductor layer 240 according to one exemplary embodiment may be comprised undoped $Al_xGa_{1-x}N$ (0≤x≤1). Even when the first semiconductor layer 240 is comprised the undoped layer, the first semiconductor layer 240 exerts the stress to reduce 2DEG (2 Dimensional electron gas) resulting from a piezoelectric field effect.

The first semiconductor layer 240 according to another exemplary embodiment may be doped with a first dopant which may be a P type dopant. The first dopant may be magnesium (Mg), zinc (Zn), calcium (Ca), strontium (Sr), carbon (C), barium (Ba) or the like.

The first semiconductor layer 240 may be doped with a P type dopant to contain holes therein. When the first semiconductor layer 240 contains holes, it may be possible to suppress current leakage resulting from a piezoelectric field effect occurring between the layers by the pressure generated due to differences in lattice constant between the substrate 210, the first buffer layer 220, the second buffer layer 230, the first semiconductor layer 240, and the second semiconductor layer 250. When the first semiconductor layer 240 contains the holes, it may be possible to prevent electrons from remaining between the second buffer layer 230 and the second semiconductor layer 250.

The second semiconductor layer 250 may be disposed on the first semiconductor layer 240. The second semiconductor layer 250 may comprise undoped gallium nitride (GaN). Since the first and second semiconductor layers 240 and 250 have a smaller lattice constant than that of the substrate 210, the first and second semiconductor layers 240 and 250 have a stress like the first and/or second buffer layers 220 and/or 230. The first and second semiconductor layers 240 and 250 may exert the stress and hence may be bent in a convex shape. This stress counteracts the stress of the substrate 210, the first buffer layer 220 or the second buffer layer 230. In this way, the stress applied to the second semiconductor layer 250 may be reduced.

The third semiconductor layer 260 may be disposed on the second semiconductor layer 250. The third semiconductor layer 260 may comprise gallium nitride (GaN). The third semiconductor layer 260 may be doped with a first dopant which may be a P type dopant. The first dopant may be magnesium (Mg), zinc (Zn), calcium (Ca), strontium (Sr), carbon (C), barium (Ba) or the like.

Since the third semiconductor layer 260 has a smaller lattice constant than that of the substrate 210, the third semiconductor layer 260 has a stress like the first and/or second buffer layers 220 and/or 230. The third semiconductor layer 260 may exert the stress and hence may be bent in a convex shape. This stress counteracts the stress of the substrate 210, the first buffer layer 220 or the second buffer layer 230.

The third semiconductor layer 260 may minimize a P type doped region in the semiconductor device 200. Thus, the third semiconductor layer 260 may minimize a crystal quality deterioration of the nitride semiconductor resulting from the P type dopant. The third semiconductor layer 260 may be thinner than the second semiconductor layer 250.

The third semiconductor layer 260 may have a thickness in a range of 10 to 100 nm. When the third semiconductor layer 260 has a thickness below 10 nm, 2DEG (2 Dimensional electron gas) compensation effects cannot be obtained. When the third semiconductor layer 260 has a thickness above 100 nm, the crystal characteristics thereof may be adversely affected.

The third semiconductor layer 260 may contain holes therein. When the first semiconductor layer 240 contains the holes, it may be possible to suppress current leakage resulting from a piezoelectric field effect occurring between the layers by the pressure generated due to differences in lattice constant between the substrate 210, the first buffer layer 220, the second buffer layer 230, the first semiconductor layer 240 and the second semiconductor layer 250.

In the semiconductor device 200 according to one exemplary embodiment, bending of the semiconductor device may be minimized due to counteraction between the stresses of the layers. As the bending of the semiconductor device 200 is minimized, the concentration across the entire area of each semiconductor layer may be uniform.

Although the first, second and/or third semiconductor layers 240, 250 and 260 are grown at a slow growth rate, the first, second and/or third semiconductor layers 240, 250 and 260 have an excellent crystal characteristic. On the other hand, when the first and/or second buffer layers 220 and/or 230 are grown at a slow growth rate, the first and/or second buffer layers 220 and/or 230 do not have an excellent crystal characteristic. The first, second and/or third semiconductor layers 240, 250 and 260 may be formed using a different method than that used in forming the first and/or second buffer layers 220 and/or 230. The present disclosure is not limited thereto.

For example, the first, second and/or third semiconductor layers 240, 250 and 260 may be formed using MOCVD (metal organic chemical vapor deposition), CVD (chemical vapor deposition), PECVD (plasma enhanced CVD), MBE (molecular beam epitaxy) or HVPE (hydride vapor phase epitaxy), etc. The present disclosure is not limited thereto.

Figure 3B:
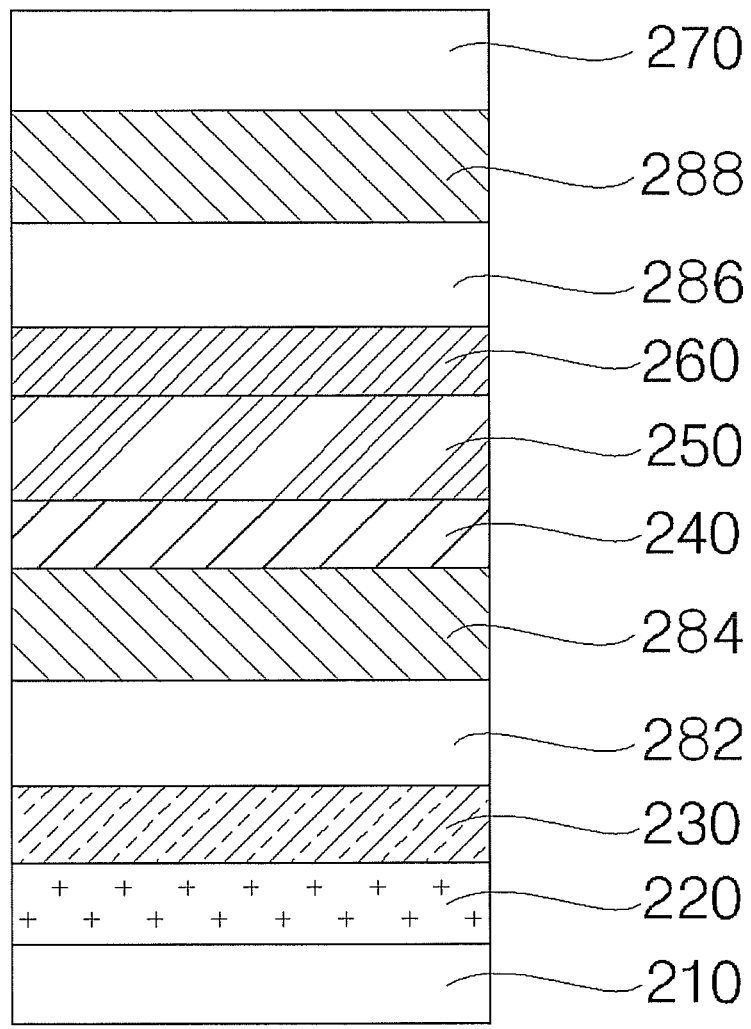
FIG. 3B is a cross-sectional view of a structure of a semiconductor device according to one exemplary embodiment.

FIG. 3B is a cross-sectional view of a semiconductor device 200 according to an exemplary embodiment different from that of FIG. 3A.

Referring to FIG. 3B, the semiconductor device 200 may further comprise third and/or fourth buffer layers 286 and/or 288 interposed between the middle layers 240, 250 and 260 and a drive unit 270.

The third buffer layer 286 may comprise undoped $Al_xGa_{1-x}N$ (0≤x≤1). That is, the third buffer layer 286 having the same composition as the third buffer layer 282 disposed under the middle layers 240, 250 and 260 may be disposed over the middle layers 240, 250 and 260.

The fourth buffer layer 288 may comprise undoped gallium nitride (GaN). That is, the fourth buffer layer 288 having the same composition as the fourth buffer layer 284 disposed under the middle layers 240, 250 and 260 may be disposed over the middle layers 240, 250 and 260.

The third and/or fourth buffer layers 286 and/or 288 may not be doped with a P type dopant to have an excellent crystal characteristic. Thus, the third and/or fourth buffer layers 286 and/or 288 may improve crystal characteristics of the drive unit 270 disposed over the same.

Figure 4:
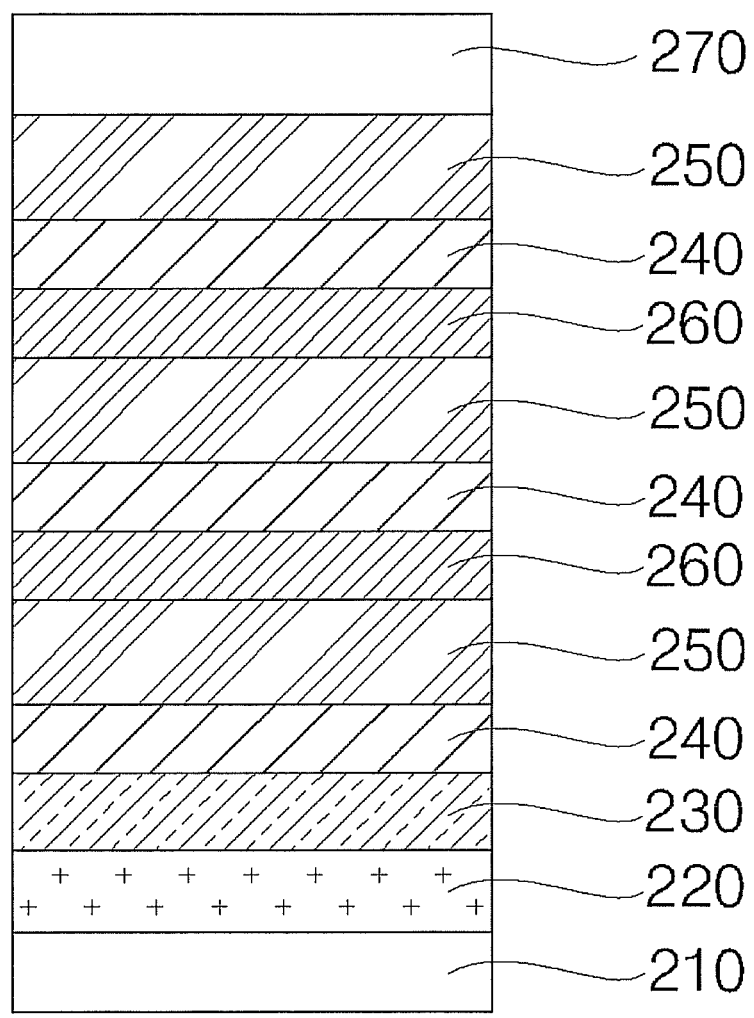
FIG. 4 is a cross-sectional view of a structure of a semiconductor device according to one exemplary embodiment.

Referring to FIG. 4, the first, second and third semiconductor layers 240, 250 and 260 may comprise a plurality of first, and second and third semiconductor layers respectively. The first, second and third semiconductor layers 240, 250 and 260 may be disposed to alternate with one another. As the alternating number of the first, second and third semiconductor layers 240, 250 and 260 increases, the stress of the first, second and third semiconductor layers 240, 250 and 260 increasingly counteracts the stress of the substrate 210, the first buffer layer 220 or the second buffer layer 230.

Figure 5:
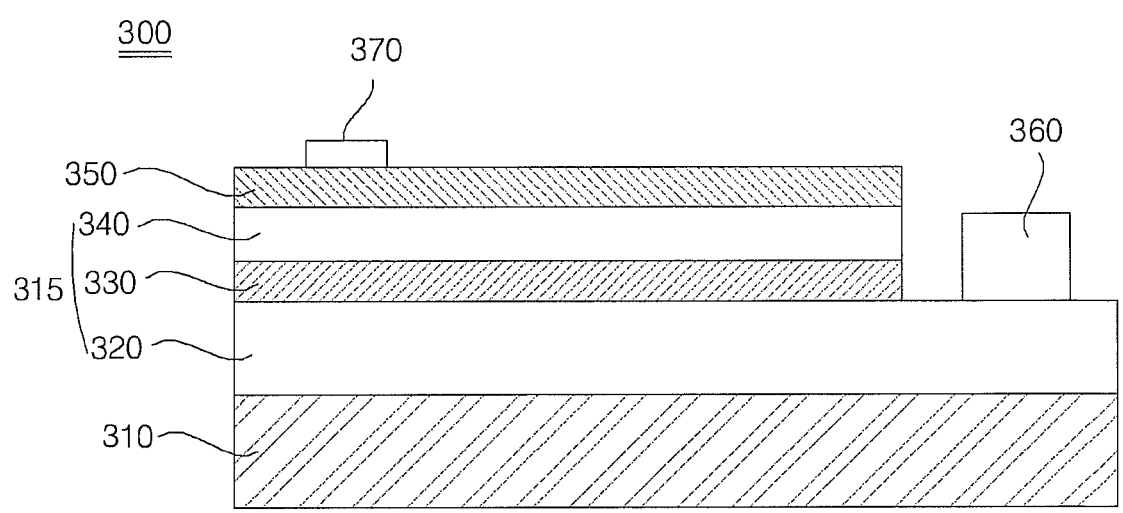
FIG. 5 is a cross-sectional view of a structure of a drive unit according to one exemplary embodiment.

FIG. 5 is a cross-sectional view of a structure of a drive unit 300 of a semiconductor device according to one exemplary embodiment.

Referring to FIG. 5, the drive unit 300 may comprise a light emitting structure 315 having a first conduction type semiconductor layer 320, a second conduction type semiconductor layer 340 and an active layer disposed between the first and second conduction type semiconductor layers 320 and 340. The light emitting structure 315 may be disposed over a middle layer 310. The present disclosure is not limited thereto. The middle layer 310 may be made of a material to allow lattice constants of the light emitting structure 315 and a layer disposed under the middle layer 310 to match each other.

The active layer 330 may be disposed between the first and second conduction type semiconductor layers 320 and 340.

One of the first and second conduction type semiconductor layers 320 and 340 may be implemented as a P type semiconductor layer doped with a P type dopant. The other of the first and second conduction type semiconductor layers 320 and 340 may be implemented as an N type semiconductor layer doped with an N type dopant. When the first conduction type semiconductor layer 320 is implemented as a P type semiconductor layer, the second conduction type semiconductor layer 340 may be implemented as an N type semiconductor layer, and vice versa.

The P type semiconductor layer may be comprised a semiconductor material having a composition of $In_xAl_yGa_{1-x-y}N$ ($0 \leq x \leq 1$, $0 \leq y \leq 1$, and $0 \leq x+y \leq 1$) such as gallium nitride (GaN), aluminum nitride (AlN), aluminum gallium nitride (AlGaN), indium gallium nitride (InGaN), indium nitride (InN), indium aluminum gallium nitride (InAlGaN), aluminum indium nitride (AlInN) or the like which is doped with a P type dopant such as magnesium (Mg), zinc (Zn), calcium (Ca), strontium (Sr), carbon (C), barium (Ba) or the like.

The N type semiconductor layer may be comprised a semiconductor material having a composition of $In_xAl_yGa_{1-x-y}N$ ($0 \leq x \leq 1$, $0 \leq y \leq 1$, and $0 \leq x+y \leq 1$) such as gallium nitride (GaN), aluminum nitride (AlN), aluminum gallium nitride (AlGaN), indium gallium nitride (InGaN), indium nitride (InN), indium aluminum gallium nitride (InAlGaN), aluminum indium nitride (AlInN) or the like which is doped with an N type dopant such as silicon (Si), germanium (Ge), tin (Sn), selenium (Se), tellurium (Te), etc.

The active layer 330 may be disposed between the first and second conduction type semiconductor layers 320 and 340. The active layer 330 may be a single or multiple quantum well structure, a quantum-wire structure, a quantum dot structure or the like using a Group III-Group V compound semiconductor material.

When the active layer 330 has the quantum well structure, the quantum well structure may be a single or multiple quantum well structure comprising a well layer having a composition of $In_xAl_yGa_{1-x-y}N$ ($0 \leq x \leq 1$, $0 \leq y \leq 1$, and $0 \leq x+y \leq 1$) and a barrier layer having a composition of $In_aAl_bGa_{1-a-b}N$ ($0 \leq a \leq 1$, $0 \leq b \leq 1$, and $0 \leq a+b \leq 1$). The well layer may be comprised a material having a smaller energy band gap than that of the barrier layer.

On and/or beneath the active layer 330, an electrically conductive cladding layer (not shown) may be disposed. The electrically conductive cladding layer (not shown) may be comprised an AlGaN based semiconductor material and may have a larger energy band gap than that of the active layer 330.

Figure 6:
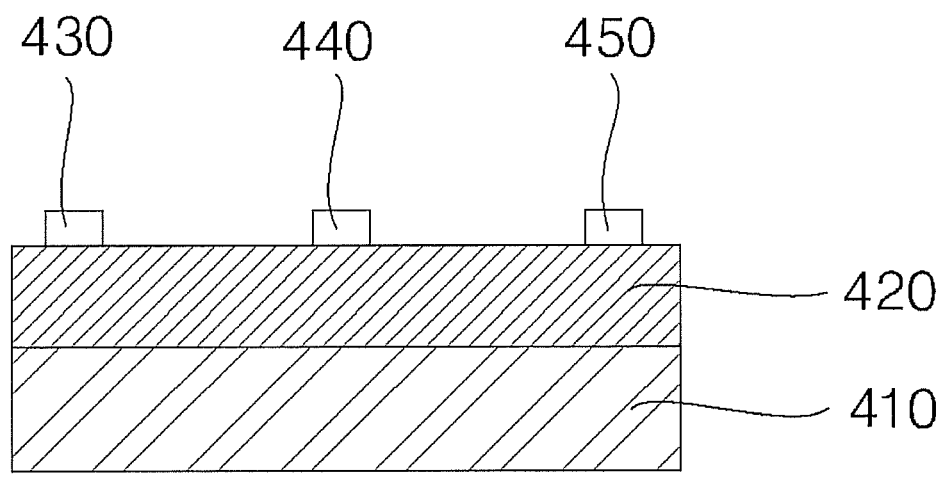
FIG. 6 is a cross-sectional view of a structure of a drive unit according to one exemplary embodiment.

FIG. 6 is a cross-sectional view of a structure of a drive unit 400 according to another exemplary embodiment.

Referring to FIG. 6, the drive unit 400 may comprise a first material layer 410, a second material layer 420 disposed on the first material layer 410 and supplying a channel, a source electrode 430 disposed on the second material layer 420, a gate electrode 440 disposed on the second material layer 420 and a drain electrode 450 disposed on the second material layer 420.

The first material layer 410 may have smaller polarizability and energy band gap than those of the second material layer 420. The first material layer 410 may be a semiconductor layer. For example, the first material layer 410 may comprised gallium nitride (GaN) or indium gallium nitride (InGaN). The present disclosure is not limited thereto.

The second material layer 420 may be a semiconductor layer. For example, the second material layer 420 may consist essentially of aluminum gallium nitride (AlGaN) or aluminum nitride (AlN). The present disclosure is not limited thereto.

The second material layer 420 may be polarized due to a difference in the polarizability between the first and second material layers 410 and 420.

Charges of the second material layer 420 may be polarized charges. Charges occurring at an interface between the first and second material layers 410 and 420 may be 2 dimensional electron gas (2DEG). The second material layer 420 may be a channel supply layer to enable a 2DEG channel to be formed in the first material layer 410. In the second material layer 420, the 2 dimensional electron gas may counteract a surface charge resulting from the polarization. The first material layer 410 may be a channel formation layer.

The source, gate and drain electrodes 430, 440 and 450 may be disposed on the second material layer 420. The source, gate and drain electrodes 430, 440 and 450 may be spaced from one another.

According to another exemplary embodiment, an insulation layer (not shown) may be disposed between the gate electrode 440 and the second material layer 420. The insulation layer (not shown) may be comprised an electrically insulating material. For example, the electrically insulating material may comprised $Al_2O_3$, $SiO_2$ or SiN.

The semiconductor device according to the above-described exemplary embodiments may comprise the middle layers. Thus, the current leakage due to a piezoelectric field effect may be suppressed. As a result, the drive unit may be reliably operated.

A semiconductor device according to the present disclosure is not limited to the above-described exemplary embodiments in terms of configuration and manufacturing process. All or parts of each of the above-described exemplary embodiments may be selectively combined with each other such that a variety of medications may be made to the above-described exemplary embodiments.

Particular features, structures, or characteristics described in connection with the embodiment are comprised in at least one embodiment of the present disclosure and not necessarily in all embodiments. Furthermore, the particular features, structures, or characteristics of any specific embodiment of the present disclosure may be combined in any suitable manner with one or more other embodiments or may be changed by those skilled in the art to which the embodiments pertain. Therefore, it is to be understood that contents associated with such combination or change fall within the spirit and scope of the present disclosure.

Although embodiments have been described with reference to a number of illustrative embodiments thereof, it should be understood that numerous other modifications and applications may be devised by those skilled in the art that will fall within the intrinsic aspects of the embodiments. More particularly, various variations and modifications are possible in concrete constituent elements of the embodiments. In addition, it is to be understood that differences relevant to the variations and modifications fall within the spirit and scope of the present disclosure defined in the appended claims.

What is claimed is:

1. A semiconductor device comprising:
a substrate;
buffer layers comprising:
   a first semiconductor layer disposed on the substrate and including $Al_xGa_{1-x}N$ ($0 \leq x \leq 1$) doped with a first conduction type dopant, and a second semiconductor layer disposed on the first semiconductor layer and including undoped gallium nitride (GaN);
a drive unit disposed on the second semiconductor layer;
a third buffer layer disposed between the substrate and the buffer layers, and including undoped $Al_xGa_{1-x}N$ ($0 \leq x \leq 1$); and
a fourth buffer layer disposed between the third buffer layer and the buffer layers and including undoped gallium nitride (GaN).

2. The semiconductor device of claim 1, wherein the middle buffer layers comprise a plurality of the first semiconductor layers and a plurality of the second semiconductor layers,
wherein the first and second semiconductor layers are alternated with each other.

3. The semiconductor device of claim 1, wherein the substrate comprises at least one selected from a group comprising silicon (Si), germanium (Ge), gallium arsenide (GaAs), zinc oxide (ZnO), silicon carbide (SiC), silicon germanium (SiGe), gallium nitride (GaN) and gallium oxide ($Ga_2O_3$).

4. The semiconductor device of claim 1, wherein the first conduction type dopant is a P type dopant.

5. The semiconductor device of claim 1, further comprising a first buffer layer disposed between the substrate and the buffer layers, and including aluminum nitride (AlN).

6. The semiconductor device of claim 1, wherein the drive unit comprises:
a first material layer to form a channel;
a second material layer disposed on the first material layer to supply the channel; and
source, gate and drain electrodes disposed on the second material layer respectively.

7. The semiconductor device of claim 1, wherein the drive unit comprises a first conduction type semiconductor layer, a second conduction type semiconductor layer and an active layer between the first and second conduction type semiconductor layers.

8. A semiconductor device comprising: a substrate; a first semiconductor layer on the substrate and including $Al_xGa_{1-x}N$ ($0 \leq x \leq 1$) doped with a first conduction type dopant; a second semiconductor layer on the first semiconductor layer and including undoped gallium nitride (GaN); a drive unit on the second semiconductor layer; a first buffer layer between the substrate and the first and second semiconductor layers, and including undoped $Al_xGa_{1-x}N$ ($0 \leq x \leq 1$); a second buffer layer disposed between the first buffer layer and the first and second semiconductor layers and including undoped gallium nitride (GaN).

9. The semiconductor device of claim 8, wherein the first and second semiconductor layers comprise a plurality of the first semiconductor layers and a plurality of the second semiconductor layers,
wherein the first and second semiconductor layers are alternated with each other.

10. The semiconductor device of claim 8, wherein the substrate comprises at least one selected from a group comprising silicon (Si), germanium (Ge), gallium arsenide (GaAs), zinc oxide (ZnO), silicon carbide (SiC), silicon germanium (SiGe), gallium nitride (GaN) and gallium oxide ($Ga_2O_3$).

11. The semiconductor device of claim 8, wherein the first conduction type dopant is a P type dopant.

12. The semiconductor device of claim 8, further comprising another buffer layer disposed between the substrate and the first and second semiconductor layers, and including aluminum nitride (AlN).

13. The semiconductor device of claim 8, wherein the drive unit comprises a first conduction type semiconductor layer, a second conduction type semiconductor layer and an active layer between the first and second conduction type semiconductor layers.

* * * * *